(12) United States Patent
Tennessen et al.

(10) Patent No.: US 8,933,701 B2
(45) Date of Patent: Jan. 13, 2015

(54) MASS DISTRIBUTION INDICATION OF FLOW BATTERY STATE OF CHARGE

(71) Applicant: Primus Power Corporation, Hayward, CA (US)

(72) Inventors: Peter Tennessen, San Francisco, CA (US); Alisa Peterson, Menlo Park, CA (US); Paul Kreiner, San Francisco, CA (US); Lauren Wessel Hart, San Francisco, CA (US); Ryan Larsen, San Francisco, CA (US); Jonathan Hall, San Mateo, CA (US)

(73) Assignee: Primus Power Corporation, Hayward, CA (US)

( * ) Notice: Subject to any disclaimer, the term of this patent is extended or adjusted under 35 U.S.C. 154(b) by 0 days.

(21) Appl. No.: 14/174,048

(22) Filed: Feb. 6, 2014

(65) Prior Publication Data

US 2014/0152314 A1    Jun. 5, 2014

Related U.S. Application Data

(63) Continuation of application No. 13/681,826, filed on Nov. 20, 2012.

(51) Int. Cl.
*G01N 27/416* (2006.01)
*G01R 31/36* (2006.01)
(Continued)

(52) U.S. Cl.
CPC .............. *G01R 31/3606* (2013.01); *H01M 2/40* (2013.01); *H01M 8/04619* (2013.01); *Y02E 60/50* (2013.01); *Y02E 60/528* (2013.01)
USPC .......................................... 324/427; 320/134

(58) Field of Classification Search
CPC ................................................... G01R 31/3631
USPC .......................... 324/426–450; 429/91, 50, 51
See application file for complete search history.

(56) References Cited

U.S. PATENT DOCUMENTS

| 3,644,190 A | 2/1972 | Weist et al. |
| 3,713,888 A | 1/1973 | Symons |

(Continued)

FOREIGN PATENT DOCUMENTS

| JP | 63-314782 A | 12/1988 |
| JP | 02-010671 A | 1/1990 |

(Continued)

OTHER PUBLICATIONS

Symons, Philip C., "Advanced Technology Zinc/Chlorine Batteries for Electric Utility Load Leveling," 19th Intersociety Energy Conversion Engineering Conf., 1984, vol. 2, 857-862.

(Continued)

*Primary Examiner* — Yalkew Fantu
(74) *Attorney, Agent, or Firm* — The Marbury Law Group, PLLC

(57) ABSTRACT

An electrochemical device includes at least one electrochemical cell having an anode electrode and a cathode electrode, a reservoir configured to store an electrolyte and a mass distribution measuring device. The mass distribution measuring device includes at least one of a scale, a first pressure sensor located in a lower portion of the reservoir and a second pressure sensor located in an upper portion of the reservoir, or at least one strain gauge or load cell configured to measure a change a weight of the at least one electrochemical cell.

33 Claims, 2 Drawing Sheets

Fig. 1

(51) Int. Cl.
*H01M 2/40* (2006.01)
*H01M 8/04* (2006.01)

(56) References Cited

U.S. PATENT DOCUMENTS

| | | | |
|---|---|---|---|
| 3,773,561 A | 11/1973 | Bjorkman | |
| 3,813,301 A | 5/1974 | Carr | |
| 3,909,298 A | 9/1975 | Carr | |
| 3,935,024 A | 1/1976 | Symons | |
| 3,940,283 A | 2/1976 | Symons | |
| 3,954,502 A | 5/1976 | Symons et al. | |
| 3,993,502 A | 11/1976 | Bjorkman, Jr. | |
| 4,001,036 A | 1/1977 | Berman et al. | |
| 4,020,238 A | 4/1977 | Symons | |
| 4,025,697 A | 5/1977 | Hart | |
| 4,068,043 A | 1/1978 | Carr | |
| 4,071,660 A | 1/1978 | Hart | |
| 4,072,540 A | 2/1978 | Symons et al. | |
| 4,086,393 A | 4/1978 | Hart | |
| 4,100,332 A | 7/1978 | Carr | |
| 4,115,529 A | 9/1978 | Behling | |
| 4,127,701 A | 11/1978 | Symons et al. | |
| 4,146,680 A | 3/1979 | Carr et al. | |
| 4,162,351 A | 7/1979 | Putt et al. | |
| 4,200,684 A | 4/1980 | Bro | |
| 4,257,867 A | 3/1981 | Hammond et al. | |
| 4,273,839 A | 6/1981 | Carr et al. | |
| 4,287,267 A | 9/1981 | Whittlesey et al. | |
| 4,306,003 A | 12/1981 | Henriksen | |
| 4,307,159 A | 12/1981 | Hammond et al. | |
| 4,320,179 A | 3/1982 | Hart | |
| 4,371,825 A | 2/1983 | Chi et al. | |
| 4,413,042 A | 11/1983 | Carr | |
| 4,414,292 A | 11/1983 | Kiwalle et al. | |
| 4,415,847 A | 11/1983 | Galloway | |
| 4,518,663 A | 5/1985 | Kodali et al. | |
| 4,518,664 A | 5/1985 | Whittlesey et al. | |
| 4,534,833 A | 8/1985 | Carr et al. | |
| 4,567,120 A | 1/1986 | Jorne et al. | |
| 4,678,656 A | 7/1987 | Bjorkman, Jr. et al. | |
| 4,728,587 A | 3/1988 | Horie et al. | |
| 4,746,585 A | 5/1988 | Stoner et al. | |
| 5,580,675 A * | 12/1996 | Rouhani | 429/90 |
| 8,039,161 B2 | 10/2011 | Winter | |
| 8,137,831 B1 | 3/2012 | la O' et al. | |
| 8,202,641 B2 | 6/2012 | Winter et al. | |
| 8,236,445 B2 | 8/2012 | Winter | |
| 2004/0234843 A1 | 11/2004 | Skyllas-Kazacos | |
| 2005/0181273 A1 | 8/2005 | Deguchi et al. | |
| 2005/0244707 A1 | 11/2005 | Skyllas-Kazacos | |
| 2008/0193828 A1 | 8/2008 | Sahu | |
| 2009/0115420 A1* | 5/2009 | Koch et al. | 324/432 |
| 2009/0239131 A1 | 9/2009 | Winter | |
| 2010/0021805 A1 | 1/2010 | Winter | |
| 2011/0070468 A9 | 3/2011 | Winter | |
| 2012/0058370 A1* | 3/2012 | Kell et al. | 429/51 |
| 2012/0328910 A1* | 12/2012 | la O' et al. | 429/51 |
| 2013/0029185 A1* | 1/2013 | Ridley et al. | 429/51 |
| 2013/0252041 A1* | 9/2013 | Fujimoto et al. | 429/70 |

FOREIGN PATENT DOCUMENTS

| | | |
|---|---|---|
| WO | WO 2008/089205 A2 | 7/2008 |
| WO | WO 2011/011533 A3 | 1/2011 |

OTHER PUBLICATIONS

EPRI Report, EM-1051 (parts 1-3), Apr. 1979, Electric Power Research Institute.

International Search Report and Written Opinion Received in connection with international application No. PCT/US2013/068485; mailed Feb. 25, 2014.

* cited by examiner

MASS DISTRIBUTION INDICATION OF FLOW BATTERY STATE OF CHARGE

CROSS-REFERENCE TO RELATED PATENT APPLICATIONS

This application is a continuation application of U.S. application Ser. No. 13/681,826, filed Nov. 20, 2012, which is incorporated herein by reference in its entirety.

FIELD

The present invention is directed to electrochemical systems and methods of using the same.

BACKGROUND

The development of renewable energy sources has revitalized the need for large-scale batteries for off-peak energy storage. The requirements for such an application differ from those of other types of rechargeable batteries such as lead-acid batteries. Batteries for off-peak energy storage in the power grid generally are required to be of low capital cost, long cycle life, high efficiency, and low maintenance.

One type of electrochemical energy system suitable for such energy storage is a so-called "flow battery" which uses a halogen component for reduction at a normally positive electrode, and an oxidizable metal adapted to become oxidized at a normally negative electrode during the normal operation of the electrochemical system. An aqueous metal halide electrolyte is used to replenish the supply of halogen component as it becomes reduced at the positive electrode. The electrolyte is circulated between the electrode area and a reservoir area. One example of such a system uses zinc as the metal and chlorine as the halogen.

Such electrochemical energy systems are described in, for example, U.S. Pat. Nos. 8,039,161, 8,236,445, 8,202,641, and 8,137,831, the disclosures of which are hereby incorporated by reference in their entirety.

SUMMARY

An embodiment relates to an electrochemical device including at least one electrochemical cell comprising an anode electrode and a cathode electrode, a reservoir configured to store an electrolyte and a mass distribution measuring device. The mass distribution measuring device including at least one of a scale, a first pressure sensor located in a lower portion of the reservoir and a second pressure sensor located in an upper portion of the reservoir or at least one strain gauge or load cell configured to measure a change a weight of the at least one electrochemical cell.

Another embodiment relates to a method of determining the state of charge in a flow battery including measuring a mass distribution characteristic of the flow battery to determine the state of charge. The measuring includes measuring one or more of a weight of an electrolyte reservoir, a weight of an electrolyte in the electrolyte reservoir, a pressure difference of an electrolyte between a lower portion of the reservoir and an upper portion of the reservoir, or a weight of a stack of flow battery cells.

DETAILED DESCRIPTION

Figure 1:
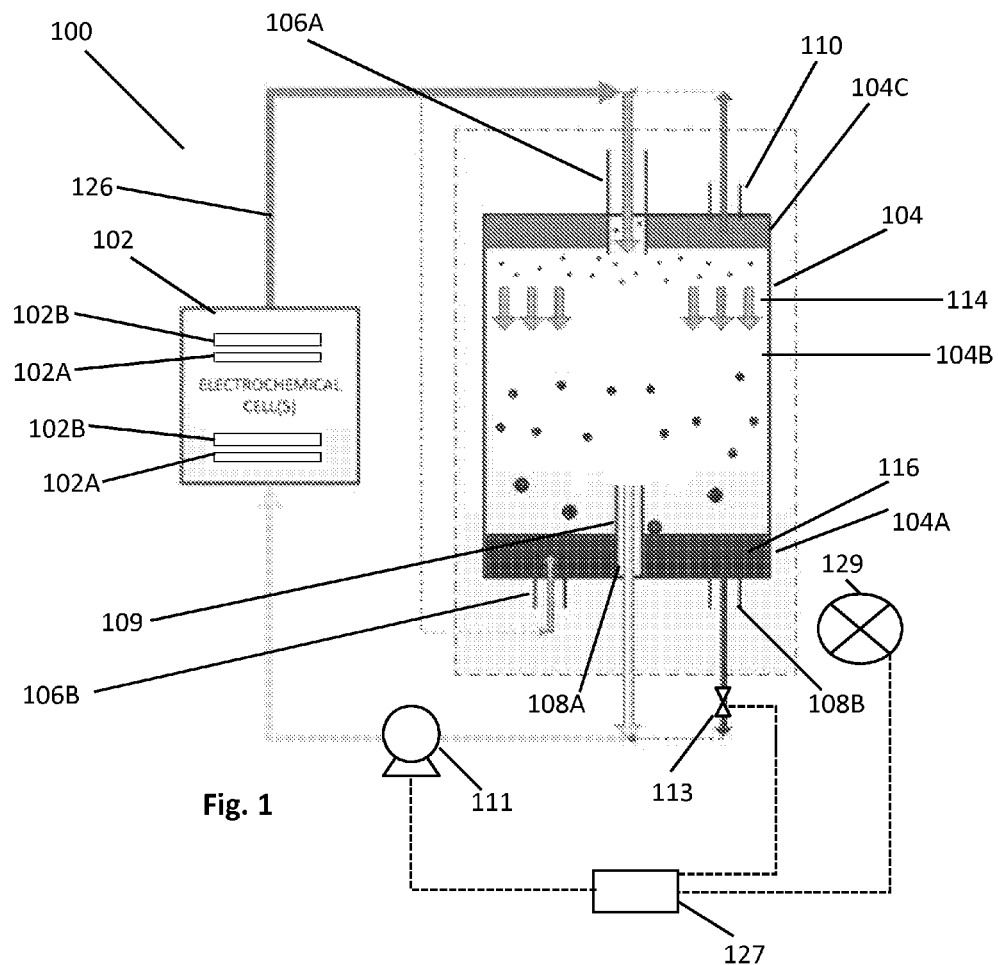
FIG. 1 is a schematic flow diagram of an electrochemical system according to an embodiment.

In any electrochemical system, such as a battery and especially in a secondary battery, it is often valuable to know the amount of stored energy remaining, commonly called the state of charge. The most common method of measuring the state of charge is to measure the voltage of the cell(s). However, there are a number of problems with this approach. Applying charge or discharge current affects the voltage. Thus, for an accurate measurement, the cell(s) must be at rest. That is, for an accurate measurement, the cell should be providing little or no current. Also, the accuracy required for the voltage measurement is high. Because of this, high impedance connections in the voltage measurement chain can skew the results.

Another conventional method for determining the amount of stored energy remaining, often used in conjunction with measuring the cell voltage, is the mathematical integration of cell current over time. If the amount of electrical energy put into the battery during charge is known, it is theoretically possible to know how much charge remains available for discharge. However, due to efficiency losses, not all of the energy used to charge the battery will be available for discharge. Thus, the efficiency is difficult to predict as it is affected by many factors including, but not limited, to age of the cell, temperature, charge rate, and discharge rate.

Rather than measure the voltage or integrate the cell current over time, embodiments of the invention use mass distribution measurements to determine the state of charge of a flow battery. As the battery is charged, high density constituents of the electrolyte solution are deposited on the electrodes and therefore removed from the electrolyte solution, decreasing its density. During discharge the opposite occurs. This redistribution of mass can be measured through changes in several system properties (such as one or more of (e.g. 1, 2 or all) weight of the electrolyte tank, density of electrolyte fluid and weight of the electrodes). These properties are nearly linear with respect to state of charge and are not affected by efficiency losses caused by dissipation in cables, waste heat produced in the cell, electrode plating corrosion, and/or shunt currents in the electrochemical cells. Measurements of these properties can be taken continuously and do not shift in response to applied charge or discharge currents. Although fluid density may vary slightly with temperature and pressure, both of these parameters may be controlled in the flow battery and thus, the effects are minor. Optionally, the changes in density due to changes in temperature and pressure may be determined and corrected for.

The embodiments disclosed herein relate to an electrochemical system (also sometimes referred to as a "flow battery"). The electrochemical system can utilize a metal-halide electrolyte and a halogen reactant, such as molecular chlorine or bromine or bromine complexes. The halide in the metal-halide electrolyte and the halogen reactant can be of the same type. For example, when the halogen reactant is molecular chlorine, the metal halide electrolyte can be an aqueous electrolyte which contains at least one metal chloride, such as $ZnCl_2$. If the halogen reactant is bromine, the metal halide electrolyte can be an aqueous electrolyte which contains at least one metal bromide, such as $ZnBr_2$. The electrolyte may also include a halogen reactant, such as a bromine complex, such as Br-MEP, discussed in more detail below.

The electrochemical system can include a sealed vessel containing at least one electrochemical cell in its inner volume, such as a stack of cells, a metal-halide electrolyte and a halogen reactant, an electrolyte reservoir, and a flow circuit configured to deliver the metal-halide electrolyte and the halogen reactant between the reservoir and the stack of electrochemical cells. The sealed vessel can be a pressure vessel or a vessel that is maintained at atmospheric pressure. In alternative embodiments, the stack of electrochemical cells is not located in a sealed vessel.

The flow circuit may be a closed loop circuit that is configured to deliver the halogen reactant, preferably in the liquefied or liquid state, and the at least one electrolyte between the reservoir and the stack of cell(s). In many embodiments, the loop circuit may be a sealed loop circuit. Although the components, such as the halogen reactant and the metal halide electrolyte, circulated through the closed loop are preferably in a liquefied state, the closed loop may contain therein some amount of gas, such as chlorine, bromine gas or hydrogen.

Preferably, the loop circuit is such that the metal halide electrolyte and the halogen reactant circulate through the same flow path without a separation in the cell(s).

Each of the electrochemical cell(s) may comprise a first electrode, which may serve as a positive electrode, and a second electrode, which may serve as a negative electrode and a reaction zone between the electrodes.

In many embodiments, the reaction zone may be such that no separation of the halogen reactant, such as the halogen reactant or ionized halogen reactant dissolved in water of the electrolyte solution, occurs in the reaction zone. The reaction zone may be such that it does not contain a membrane or a separator between the positive and negative electrodes of the same cell that is impermeable to the halogen reactant, such as the halogen reactant or ionized halogen reactant dissolved in water of the electrolyte solution. For example, the reaction zone may be such that it does not contain a membrane or a separator between the positive and negative electrodes of the same cell that is impermeable to the bromine or bromine complex reactant, such that no separation of halogen ions, such as halogen ions formed by reducing the halogen reactant at one of the electrodes, from the rest of the flow occurs in the reaction zone.

Furthermore, the cell may be a hybrid flow battery cell rather than a redox flow battery cell. In the hybrid flow battery cell, a metal, such as zinc is plated onto one of the electrodes (e.g. the negative electrode), the reaction zone lacks an ion exchange membrane which allows ions to pass through it (i.e., there is no ion exchange membrane between the cathode and anode electrodes) and the electrolyte is not separated into a catholyte and anolyte by the ion exchange membrane.

In certain embodiments, the first electrode may be a porous electrode or contain at least one porous element. For example, the first electrode may comprise a porous or a permeable metal electrode, such as ruthenium or iridium coated titanium or tantalum, such as ruthenium oxide coated titanium. In a discharge mode, the first electrode may serve as a positive electrode, at which the halogen may be reduced into halogen ions. The use of the porous material in the first electrode may increase efficiency of the halogen reactant's reduction.

In many embodiments, the second electrode may comprise a metal, such as titanium or ruthenized titanium (i.e., ruthenium coated titanium, where the ruthenium is oxidized to form ruthenium oxide) that is plated with zinc. Alternatively, the second electrode may comprise carbon or carbon impregnated plastic.

FIG. 1 illustrates an electrochemical system 100 according to an embodiment. This embodiment includes one or more electrochemical cells 102, each cell 102 containing a positive electrode 102A and a negative electrode 102B, fluidly connected to a vertically oriented reservoir 104. In an embodiment, the reservoir 104 includes three portions: a lower portion 104A, a middle portion 104B and an upper portion 104C. Aqueous halogen electrolyte such as zinc chloride and/or zinc bromide, e.g. $ZnBr_2$, complexed with a complexing agent, (such as a quaternary ammonium bromide (QBr), such as N-ethyl-N-methyl-morpholinium bromide (MEM), N-ethyl-N-methyl-pyrrolidinium bromide (MEP) or Tetra-butyl ammonium bromide (TBA)) is stored in the lower portion 104A of the reservoir 104. The middle portion 104B includes aqueous halogen electrolyte (e.g., $ZnCl_2$ and/or $ZnBr_2$) with little or no complexing agent. Gaseous species, such as halogen (e.g. $Cl_2$ or $Br_2$) and hydrogen gas are stored in the upper portion 104C (e.g., head space) of the reservoir 104. The reservoir 104 may also include internal structures in the middle portions 104B of the reservoir 104 such as baffles.

In an embodiment, the reservoir 104 includes a primary inlet 106A through which electrolyte 114 is received from the electrochemical cells 102. In an embodiment, the primary inlet 106A is located in an upper portion 104C of the reservoir 104. Also included in the upper portion 104C of the reservoir 104 is a gas outlet 110. Gas located in the upper portion (or head space) 104C can be removed from the reservoir 104 via the gas outlet 110. If desired all or a portion of the gas removed from the reservoir 110 can be mixed with the electrolyte 114. The reservoir 104 may also include a secondary inlet 106B. In an embodiment, the secondary inlet 106B may be located in the lower portion 104A of the reservoir 104. Optionally, some of the heavier complexed halogen 116 portion of the electrolyte 114 from the stack of electrochemical cells 102 may be separated from the bulk of the electrolyte 114 and be delivered to the lower portion 104A of the reservoir 104 via the secondary inlet 106B.

The reservoir 104 also includes a primary outlet 108A through which electrolyte 114 can be provided to the stack of electrochemical cells 102. In an embodiment, the primary outlet 108A is located in a middle of the lower portion 104A of the reservoir 104. In an embodiment, the primary outlet includes a conduit/pipe 109 that extends from the bottom of the reservoir 104 through the lower portion 104A of the reservoir 104 into the middle portion 104B of the reservoir 104. With this configuration, aqueous electrolyte 114 can be removed from the middle portion 104B of the reservoir 104 and provided to the stack of electrochemical cells 102 without the inclusion of excess complexed halogen 116 from the lower portion 104A of the reservoir 104. If additional complexed halogen 116 is desired, a secondary outlet 108B operatively connected to the lower portion 104A of the reservoir may be provided. Complexed halogen 116 may be provided from the lower portion 104A of the reservoir 104 through the secondary outlet 108B and mixed with the aqueous electrolyte 114 provided from the primary outlet 108A. One or more pumps 111 may be used to provide electrolyte 114 and/or complexed halogen 116 between the reservoir 104 and the stack of electrochemical cells 102. Additionally, one or more valves 113 may be used to control the amount of complex provided from the reservoir 104 to the stack of electrochemical cells 102.

Figure 2:
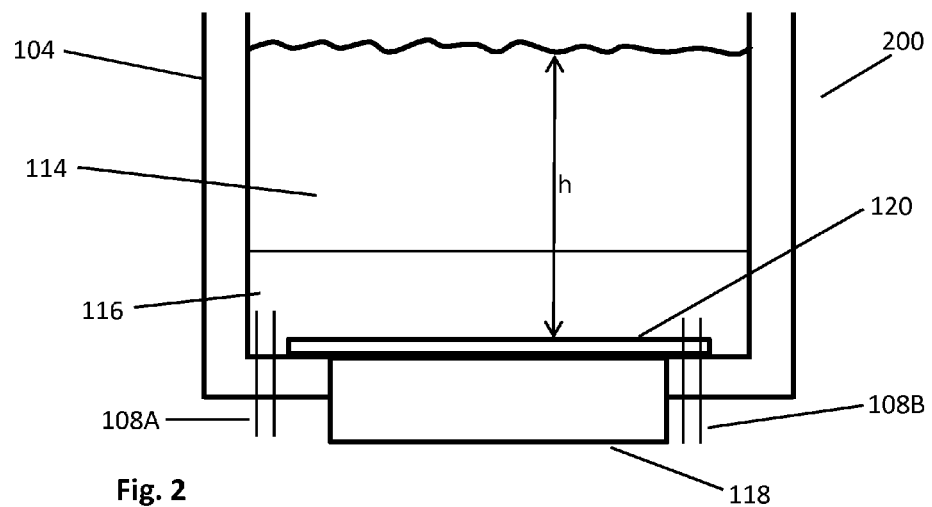
FIG. 2 is a schematic side cross sectional view of a mass distribution measuring system according to an embodiment.

FIG. 2 illustrates a mass distribution measuring system 200 according to an embodiment which may be used with the electrochemical system 100. The mass distribution measuring system 200 illustrated in FIG. 2 is used to measure the weight of the reservoir 104 or the electrolyte 114/116 in the reservoir 104. The mass distribution measuring system 200 includes a scale 118 and a diaphragm 120 at the bottom of the reservoir 104. The top plate of the scale 118 is isolated from the electrolyte by the diaphragm 120. The diaphragm 120 is flexible and flexes with increasing weight of the electrolyte 114/116 in the reservoir 104. Further, the diaphragm 120 may comprise a portion of or the entirety of the bottom surface of the reservoir 104. The diaphragm 120 may be made of any material which is chemically resistant to the electrolyte. In an alternative embodiment, a flexible bladder which holds the entire fluid volume of the tank could be used in place of the diaphragm 120.

The use of a diaphragm 120 allows the scale 118 to be of a conventional design. That is, the scale 118 need not be specially designed. The top of the scale 118 may contact the diaphragm 120 either directly or indirectly. Depending upon the balance of plant implementation, there may be variations in the fill level h of the reservoir 104 over the course of charge cycles or in various battery states. In this embodiment, the weight indicated by the scale 118 would be $F=\rho ghA$, where g is the gravitational constant, h is the height of the column of fluid above the scale 118, A is the surface area of the top plate of the scale 118, and $\rho$ is the density of the fluid (e.g. electrolyte 114/116). The scale 118 measures the force F (i.e. the weight), h is known from a control system and/or measured with the float, A and g are constant. Thus, the density $\rho$ of the electrolyte can be determined or is known. A float may be used to measure the fill level (e.g. the value of h) and correct the fluid weight measurement accordingly. The state of charge is a function of the weight of the electrolyte for a given volume of electrolyte after normalization for height. Thus, the state of charge can be determined from the weight measurement using a look-up table, database or a similar conversion algorithm, where state of charge and weight were calibrated to each other during an initial calibration step.

Figure 3:
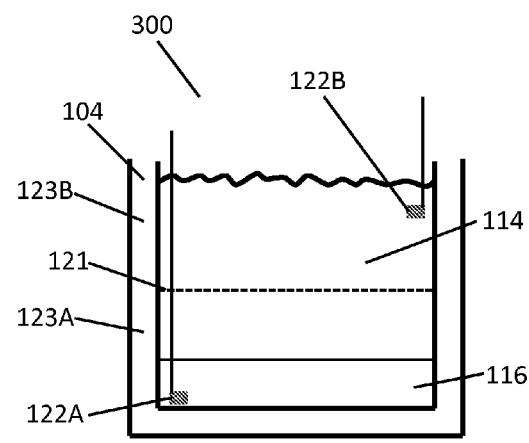
FIG. 3 is a schematic side cross sectional view of a mass distribution measuring system according to another embodiment.

FIG. 3 illustrates another embodiment of a mass distribution measuring system 300 which may be used to measure the electrolyte density the electrochemical system 100. In this embodiment, the density of the electrolyte 114 is measured by using a differential pressure sensor measuring electrolyte pressure in upper and lower portions of the reservoir 104. The density of the electrolyte 114 can be determined with the following equation: $P_1-P_2=\rho g \Delta h$. Where $P_1$ is measured with a pressure sensor 122A located in one portion 123A of the reservoir 104 and $P_2$ is measured with a pressure sensor 122B located in a different portion 123B of the reservoir 104 above the first portion 123A, and $\Delta h$ is the difference in height between the first and second sensor. Thus, the two sensors 122A, 122B are separated in a height direction (e.g., parallel to force of gravity) in the reservoir and both sensors are submerged in the fluid in the reservoir. The greater the separation between the sensors, the better the signal to noise ratio. For example, in a non-limiting configuration, sensor 122A is located below a centerline 121 of the reservoir 104, and sensor 122B is located above the centerline 121 of the reservoir 104. The difference in pressure is measured, g and $\Delta h$ are constant. Thus as above, the density $\rho$ of the electrolyte can be determined. This embodiment is not affected by the electrolyte fluid fill level as long as both of the pressure sensors 122A, 122B are submerged in the electrolyte 114. The density may vary by approximately 30% depending on the electrolyte and the amount of charge or discharge which is the variable to be determined. The differential pressure variation is directly proportional to the change in density and is within the range of commercially available pressure sensors. Thus, the state of charge can be determined from the pressure difference measurement using a look-up table, database or a similar conversion algorithm, where the state of charge and the pressure difference were calibrated to each other during an initial calibration step.

The two sensors 122A, 122B measure a pressure difference between the lower 123A and the upper 123B portions of the reservoir 104 and this pressure difference is proportional to the average density of all of the fluid (e.g., electrolyte and/or electrolyte plus complexed phase) between the sensors. The sensors do not need to detect a density gradient across the fluid such as might occur due to accumulation of the complexed halogen in the lower portion of the reservoir. In one configuration, the lower sensor 123A is located sufficiently high in the reservoir 104 above where the heavier, denser complexed halogen (e.g., Br-MEP, etc., complex) accumulates to avoid taking into account the denser complexed phase. In another configuration, if the lower sensor 123A is located sufficiently low in the reservoir 104 in a portion where the heavier complexed halogen accumulates, then the density gradient due to the complexed halogen phase accumulation is accounted for in the average density of fluid and state of charge calculation/determination.

Figure 4:
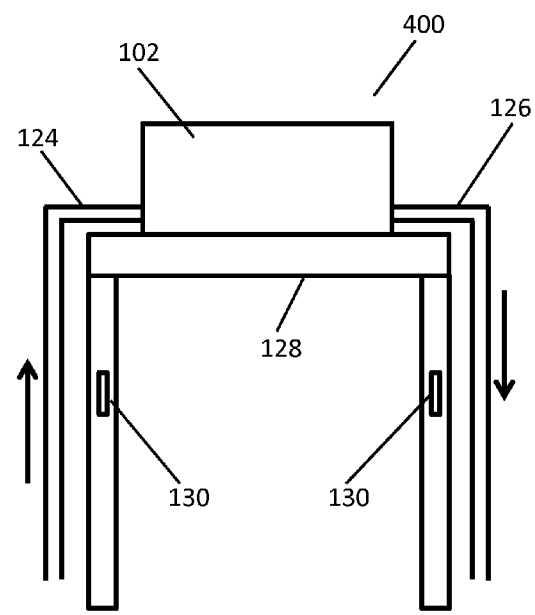
FIG. 4 is a schematic side cross sectional view of a mass distribution measuring system according to another embodiment.

An alternative embodiment of a mass distribution measuring system 400 is illustrated in FIG. 4. In this embodiment, the change in the electrode weight is measured to determine the state of charge. This may be accomplished by measuring the weight of the entire cell stack 102 by supporting cell stack 102 with load cells or mounting strain gauges 130 to the support structure 128 of the cell stack 102. As illustrated in FIG. 4, the support structure 128 is shown with strain gauges 130 attached to legs of the support structure 128. Connected to the electrode stack 102 are electrolyte inlet and outlet conduits 124, 126. In some embodiments, electrolyte inlet and outlet conduits 124, 126 may provide some mechanical support to the cell stack 102. However, if neither the electrolyte inlet nor outlet conduits 124, 126, nor the support structure 128 experience plastic deformation, each can be treated as a spring with a constant spring rate and accounted for in the determination of the weight change. In addition, since the measurement of interest is a change in weight and not the absolute weight, the strain gauges 130 can simply be calibrated as part of the manufacturing process by using an additional state of charge measurement, such as open circuit voltage to establish 0% and 100% state of charge. The change in weight may be 20-40%, such as 25-35%, of the initial weight of the stack 102. Typical strain gauge accuracy is less than +/−1%, therefore the strain gauges 130 of this embodiment need not be exceptionally accurate or costly. Thus, in an embodiment, electrical state of charge measurements and mass distribution measurements can be performed and correlated in a lookup table or database. As the electrochemical system operates, the state of charge of can be determined by performing mass distribution measurements and using the lookup table, database or algorithm.

Figure 5:
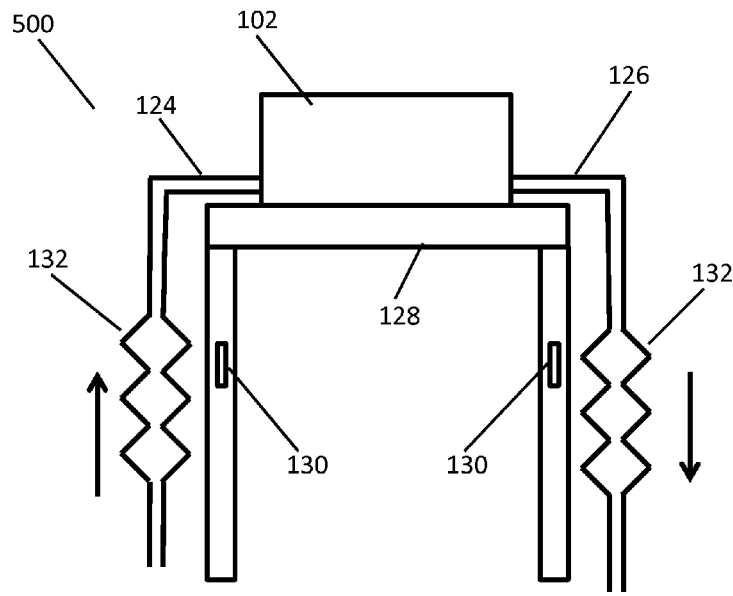
FIG. 5 is a schematic side cross sectional view of a mass distribution measuring system according to another embodiment.

FIG. 5 is a schematic of a mass distribution measuring system 500 according to another embodiment. This embodiment is similar to the embodiment illustrated in FIG. 4. However, this embodiment includes bellows 132 as part of the electrolyte inlet and outlet conduits 124, 126. The bellows 132 are flexible and contract when stress is applied and expand when stress is removed. Thus, the electrolyte inlet and outlet conduits 124, 126 provide little or no support to the electrode stack 102. It is therefore not necessary in this embodiment to account for the electrolyte inlet and outlet conduits 124, 126 by treating them as a spring.

Since mass distribution directly measures the amount of reactants that are available for the electrochemical reaction, mass distribution inherently compensates for unpredictable efficiency losses such as dissipation in cables, waste heat produced in the cell, electrode plating corrosion, and shunt currents in the electrochemical cell. Factors that may affect the mass distribution measurement include air bubbles in the system which displace fluid and change perceived mass, loss of fluid over time due to permeation or leaks and drift of sensors. Air bubbles can be generated by side reactions in the electrochemical stack 102, pump cavitation, or entrainment of air in the electrolyte flow. The above factors are also undesirable for reasons separate from mass distribution measurement. Thus, electrochemical systems are generally designed to eliminate these factors. Further, even in systems with sub optimal designs, air bubbles have been observed in volume fractions (on the order of 0.01%) that are too small to have a significant effect on mass measurements.

Leaks, like air bubble generation, are undesirable and can be eliminated in the production design. Further, gradual fluid loss due to permeation or a slow leak may be corrected for by periodically measuring state of charge with a redundant measurement, such as open circuit voltage, or even by using multiple types of mass measurement. Additionally, the fluid circuit may be designed such that that the electrochemical stack 102 is always full of electrolyte 114 when operating. Under these conditions, drift in a reservoir 102 weight measurement while stack weight remains consistent would indicate a fluid leak.

Additionally, a fault condition may be determined based on the measurement of the mass distribution characteristic. For example, the fault condition may be a leak and the control system 127 may issue a warning or stop operation of the flow battery if the leak is detected using the measurement of the mass distribution characteristic. Specifically, sudden fluid (i.e., electrolyte) loss may be detected by the scale 118 and/or strain gauges 130 as a change in state of charge disproportionate to amp-hours, voltage, or known system ratings, such as maximum charge or discharge current. In this way, the scale 118 and/or strain gauges 130 could act as a leak detector. The system may be configured such that a sudden leak would trigger a service event to fix the leak. For example, output from the scale 118 and/or strain gauges 130 may be inputted to a computer, such as a personal computer configured to send a warning, such as by email or instant message or an audible alarm, or to stop flow battery operation if a leak is detected. The computer may comprise or be a part of control system 127 or it may be a separate device from the control system 127. After servicing the system 100, the scale 118 and/or strain gauges 130 could be recalibrated. The scale 118 and/or strain gauges 130 may also be recalibrated whenever the system achieves 100% or 0% state of charge, either of which are relatively easy to determine via voltage and/or current measurement.

In another embodiment, the starting and/or stopping charge or discharge mode operation of the flow battery based on the determination of the state of charge. Thus, even in an absence of a leak, the stack of charge determination and/or the measurement of the mass distribution characteristic may be used to time the beginning or end of one of the operating modes of the flow battery. For example, the flow battery operating mode may be changed from charge mode to discharge mode or from discharge mode to charge mode based on the determination of the state of charge and/or the measurement of the mass distribution characteristic.

In another embodiment, one or more actions may be taken based the determination of the state of charge and/or the measurement of the mass distribution characteristic. The actions include varying (increasing and/or decreasing) a current density in or out of the flow battery in respective charge or discharge mode, varying a pump 111 speed to vary a bulk electrolyte flow rate into the stack of flow battery cells from a reservoir, varying the complex phase 116 flow rate into the stack of flow battery cells using the valve 113 and/or changing a temperature of the electrolyte in the stack and/or in the reservoir by changing a setting of a temperature control device 129 shown in FIG. 1, such as a heater or chiller, located adjacent to or in a heat transfer relationship to the stack and/or the reservoir.

In another embodiment, an efficiency of the flow battery may be determined based on the measurement of the mass distribution characteristic.

In some embodiments, the electrochemical system's control system 127 shown in FIG. 1 may include an analog or digital control circuit which may be connected to a general or special purpose computer or other logic device. Control system 127 may control one or more of the following parameters: pumping rate of the pump(s) 111 to control electrolyte 114 flow rate into and from the stack 102, a feed rate of the bromine complex 116 through the valve 113, current density provided in or out of the flow battery stack 102 in respective charge and discharge modes, and temperature provided by the temperature control device 129 to the electrolyte 114/116.

A person (e.g., system operator) or machine (e.g., a general purpose computer running system control software or a dedicated control system) can adjust the operating parameters of the system (e.g., voltage or current output) based on the SOC measurement. The control system which adjust the operating parameters may be the same or a different machine that determines the SOC.

The operator and/or the control system may be located in the same building as the system or in a remote location. For example, the SOC of the system used by a customer (e.g., a power generation utility) may be monitored by a person or machine located remotely from the system at the system manufacturer or monitoring service. In this configuration, the output of the sensors may be provided to the operator or control system wirelessly (e.g., via a wireless data transmitter electrically connected to the sensors) and/or via a wired connection (e.g., via the Internet).

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of determining the state of charge in a flow battery comprising: measuring a mass distribution characteristic of the flow battery to determine the state of charge, wherein the measuring comprises measuring one or more of: a weight of an electrolyte reservoir; a weight of an electrolyte in the electrolyte reservoir; a pressure difference of an electrolyte between a lower portion of the reservoir and an upper portion of the reservoir; or a weight of a stack of flow battery cells; measuring the weight of the stack of flow battery cells, wherein measuring the weight of a stack of flow battery cells comprises measuring a change in strain in a stack support with one or more strain gauges or load cells.

2. A method of determining the state of charge in a flow battery comprising:
measuring a mass distribution characteristic of the flow battery to determine the state of charge, wherein the measuring comprises measuring one or more of:
a weight of an electrolyte reservoir;
a weight of an electrolyte in the electrolyte reservoir;
a pressure difference of an electrolyte between a lower portion of the reservoir and an upper portion of the reservoir; or
a weight of a stack of flow battery cells;
performing a calibration step comprising performing an electrical state of charge measurement and then correlating the measured mass distribution characteristic to the electrical state of charge measurement;
determining the state of charge during use of the flow battery by determining the state of charge from the mass distribution characteristic using a lookup table, a database or an algorithm.

3. The method of claim 2, wherein the electrical state of charge measurement comprises establishing 0% and 100% state of charge with an open circuit voltage measurement.

4. A method of determining a state of charge in a flow battery comprising:
measuring a mass distribution characteristic of the flow battery to determine the state of charge, wherein the measuring comprises measuring one or more of:
a weight of an electrolyte reservoir;
a weight of an electrolyte in the electrolyte reservoir;
a pressure difference of an electrolyte between a lower portion of the reservoir and an upper portion of the reservoir; or
a weight of a stack of flow battery cells; and
based on at least one of the determination of the state of charge or the measurement of the mass distribution characteristic performing one or more of:
varying a current density in or out of the flow battery;
varying a pump speed to vary a bulk electrolyte flow rate into the stack of flow battery cells from a reservoir;
varying a complex phase flow rate into the stack of flow battery cells by diverting a complex phase outlet conduit into the stack; or
changing a temperature of the electrolyte by changing a setting of a heater or chiller.

5. A method of determining the state of charge in a flow battery comprising: measuring a mass distribution characteristic of the flow battery to determine the state of charge, wherein the measuring comprises measuring one or more of: a weight of an electrolyte reservoir; a weight of an electrolyte in the electrolyte reservoir; a pressure difference of an electrolyte between a lower portion of the reservoir and an upper portion of the reservoir; or a weight of a stack of flow battery cells; further comprising determining a fault condition based on the measurement of the mass distribution characteristic, wherein the fault condition is a leak and the method further comprises issuing a warning or stopping operation of the flow battery.

6. The method of claim 2, further comprising determining an efficiency of the flow battery based on the measurement of the mass distribution characteristic.

7. The method of claim 5, wherein measuring the mass distribution characteristic of the flow battery to determine the state of charge comprises measuring the weight of the electrolyte reservoir.

8. The method of claim 5, wherein measuring the mass distribution characteristic of the flow battery to determine the state of charge comprises measuring the weight of the electrolyte in the electrolyte reservoir.

9. The method of claim 8, wherein a portion of a bottom surface of the reservoir comprises a flexible diaphragm located between a scale and the electrolyte.

10. The method of claim 5, wherein measuring the mass distribution characteristic of the flow battery to determine the state of charge comprises measuring the pressure difference of the electrolyte between the lower portion of the reservoir and the upper portion of the reservoir.

11. The method of claim 5, wherein the method comprises measuring the weight of the stack of flow battery cells.

12. The method of claim 2, further comprising starting or stopping charge or discharge mode operation of the flow battery based on at least one of the determination of the state of charge or the measurement of the mass distribution characteristic.

13. The method of claim 2, further comprising changing the flow battery from charge mode to discharge mode or from discharge mode to charge mode based on at least one of the determination of the state of charge or the measurement of the mass distribution characteristic.

14. The method of claim 2, wherein measuring the mass distribution characteristic of the flow battery to determine the state of charge comprises measuring the weight of the electrolyte reservoir.

15. The method of claim 2, wherein measuring the mass distribution characteristic of the flow battery to determine the state of charge comprises measuring the weight of the electrolyte in the electrolyte reservoir.

16. The method of claim 2, wherein measuring the mass distribution characteristic of the flow battery to determine the state of charge comprises measuring the pressure difference of the electrolyte between the lower portion of the reservoir and the upper portion of the reservoir.

17. The method of claim 2, wherein measuring the mass distribution characteristic of the flow battery to determine the state of charge comprises measuring the weight of the stack of flow battery cells.

18. The method of claim 2, wherein determining the state of charge during use of the flow battery by determining the state of charge from the mass distribution characteristic comprises using the lookup table.

19. The method of claim 2, wherein determining the state of charge during use of the flow battery by determining the state of charge from the mass distribution characteristic comprises using the database.

20. The method of claim 2, wherein determining the state of charge during use of the flow battery by determining the state of charge from the mass distribution characteristic comprises using the algorithm.

21. The method of claim 4, wherein measuring the mass distribution characteristic of the flow battery to determine the state of charge comprises measuring the weight of the electrolyte reservoir.

22. The method of claim 4, wherein measuring the mass distribution characteristic of the flow battery to determine the state of charge comprises measuring the weight of the electrolyte in the electrolyte reservoir.

23. The method of claim 4, wherein measuring the mass distribution characteristic of the flow battery to determine the state of charge comprises measuring the pressure difference of the electrolyte between the lower portion of the reservoir and the upper portion of the reservoir.

24. The method of claim 4, wherein measuring the mass distribution characteristic of the flow battery to determine the state of charge comprises measuring the weight of the stack of flow battery cells.

25. The method of claim 4, wherein the step of performing is based on the state of charge of the flow battery.

26. The method of claim 4, wherein the step of performing is based on the mass distribution characteristic of the flow battery.

27. The method of claim 4, wherein the step of performing comprises varying the current density in or out of the flow battery.

28. The method of claim 4, wherein the step of performing comprises varying the pump speed to vary the bulk electrolyte flow rate into the stack of flow battery cells from the reservoir.

29. The method of claim 4, wherein the step of performing comprises varying the complex phase flow rate into the stack of flow battery cells by diverting the complex phase outlet conduit into the stack.

30. The method of claim 4, wherein the step of performing comprises changing the temperature of the electrolyte by changing the setting of the heater.

31. The method of claim 4, wherein the step of performing comprises changing the temperature of the electrolyte by changing the setting of the chiller.

32. The method of claim 5, wherein determining the fault condition based on the measurement of the mass distribution characteristic comprises issuing the warning.

33. The method of claim 5, wherein determining the fault condition based on the measurement of the mass distribution characteristic comprises issuing the stopping operation of the battery.

\* \* \* \* \*